United States Patent
Shen

(10) Patent No.: US 9,131,627 B2
(45) Date of Patent: Sep. 8, 2015

(54) HEAT DISSIPATING STRUCTURE

(75) Inventor: Ching Hang Shen, Sinjhuang (TW)

(73) Assignee: Asia Vital Components Co., Ltd., Sinjhuang (TW)

( * ) Notice: Subject to any disclaimer, the term of this patent is extended or adjusted under 35 U.S.C. 154(b) by 1753 days.

(21) Appl. No.: 12/288,524

(22) Filed: Oct. 21, 2008

(65) Prior Publication Data

US 2009/0279254 A1 Nov. 12, 2009

(30) Foreign Application Priority Data

May 8, 2008 (TW) .................. 97207957 U

(51) Int. Cl.
| H05K 5/00 | (2006.01) |
| H05K 7/20 | (2006.01) |
| F04D 25/04 | (2006.01) |
| F04D 29/58 | (2006.01) |
| G06F 1/20 | (2006.01) |

(52) U.S. Cl.
CPC ............ *H05K 7/20172* (2013.01); *F04D 25/04* (2013.01); *F04D 29/582* (2013.01); *G06F 1/20* (2013.01)

(58) Field of Classification Search
CPC ................................ H05K 5/0213; G06F 1/20
USPC .......................................... 454/184; 361/695
See application file for complete search history.

(56) References Cited

U.S. PATENT DOCUMENTS

| 2,394,109 | A | * | 2/1946 | Sanchez ........................ 62/229 |
| 4,012,163 | A | * | 3/1977 | Baumgartner et al. .... 415/208.3 |
| 4,045,878 | A | * | 9/1977 | Steffen ............................. 34/491 |
| 4,779,006 | A | * | 10/1988 | Wortham ........................ 290/55 |
| 6,163,453 | A | * | 12/2000 | Hou et al. ................. 361/679.48 |
| 6,302,778 | B1 | * | 10/2001 | Andrews et al. ................. 454/16 |
| 6,798,082 | B1 | * | 9/2004 | Chen ............................... 290/55 |
| 6,856,037 | B2 | * | 2/2005 | Yazawa et al. ................... 290/43 |
| 6,887,031 | B1 | * | 5/2005 | Tocher ............................... 415/1 |
| 6,912,816 | B2 | * | 7/2005 | O'Leary ...................... 52/173.3 |
| 6,932,561 | B2 | * | 8/2005 | Yoo ................................ 415/4.3 |
| 7,097,556 | B2 | * | 8/2006 | Su ................................. 454/184 |
| 7,108,051 | B2 | | 9/2006 | Hung ............................ 165/122 |
| 7,262,515 | B2 | * | 8/2007 | Pinkerton ......................... 290/2 |
| 7,424,906 | B2 | * | 9/2008 | Bhatti et al. ................. 165/80.3 |
| 7,436,665 | B2 | * | 10/2008 | Chen et al. .................... 361/695 |
| 7,518,283 | B2 | * | 4/2009 | Pinkerton et al. ............ 310/309 |
| 7,542,275 | B2 | * | 6/2009 | Sun .......................... 361/679.46 |
| 7,554,455 | B2 | * | 6/2009 | Gologorsky .................. 340/635 |
| 7,719,835 | B1 | * | 5/2010 | Schluter ....................... 361/695 |
| 8,011,896 | B2 | * | 9/2011 | Wu et al. ....................... 417/237 |
| 8,141,621 | B2 | * | 3/2012 | Campbell et al. ............ 165/200 |
| 8,278,868 | B2 | * | 10/2012 | Caudill ......................... 320/101 |
| 2002/0195989 | A1 | * | 12/2002 | Teramoto ..................... 320/101 |
| 2003/0133265 | A1 | * | 7/2003 | Kinsey et al. ................ 361/687 |
| 2003/0190883 | A1 | * | 10/2003 | Shockey ........................ 454/19 |
| 2004/0264127 | A1 | * | 12/2004 | Chiu ............................. 361/687 |

(Continued)

*Primary Examiner* — Steven B McAllister
*Assistant Examiner* — Frances F Hamilton
(74) *Attorney, Agent, or Firm* — C. G. Mersereau; Nikolai & Mersereau, P.A.

(57) ABSTRACT

A heat dissipating structure with a casing and at least a power-free heat-dissipating device therein is provided. The power-free heat-dissipating device is driven by an air stream outside and inside the casing to rotate. The rotating power-free heat-dissipating device introduces the air stream into the casing and expels the air stream from the casing so as to facilitate circulation favorable for heat dissipation, thereby enhancing heat dissipation, enabling power-free operation, and serving a power-saving purpose.

4 Claims, 8 Drawing Sheets

(56) References Cited

U.S. PATENT DOCUMENTS

| | | | |
|---|---|---|---|
| 2005/0074324 A1* | 4/2005 | Yoo | 415/4.3 |
| 2005/0122679 A1* | 6/2005 | Von Gutfeld et al. | 361/687 |
| 2007/0048160 A1* | 3/2007 | Pinkerton | 417/426 |
| 2007/0222223 A1* | 9/2007 | Bagepalli et al. | 290/55 |
| 2008/0075599 A1* | 3/2008 | Miller | 416/182 |
| 2008/0200113 A1* | 8/2008 | Munn et al. | 454/341 |

\* cited by examiner

HEAT DISSIPATING STRUCTURE

BACKGROUND OF THE INVENTION

1. Field of the Invention

The present invention relates to heat dissipating structures, and more particularly, to a heat dissipating structure for use with an electronic equipment casing.

2. Description of the Prior Art

A variety of electronic equipment nowadays, host computers in particular, are internally installed with various peripherals capable of high-speed computation, such as CPU, interface cards, high-capacity memory units (hard disk drives), DVD, CD/DVD-R/RW drives, power supplies, etc. Inside an airtight casing of a host computer, peripherals and electronic components in operation generate heat of different temperatures. The CPU performs computation at high speed and thereby is the largest heat-generating component inside the host computer. A problem that calls for immediate solution involves efficient elimination of heat generated from within a host computer, an operating CPU especially. Manufacturers usually install additional heat-dissipating devices in the host computers or electronic apparatus/equipment such that the heat-dissipating devices reduce ambient temperature or temperature of components inside the host computers or electronic apparatus/equipment.

Referring to FIG. 1, which is a perspective view of the prior art, a computer casing 1 taught by the prior art is installed with a motherboard 2 therein. The computer casing 1 has a rear side formed with a venting hole 11. The motherboard 2 is installed with a heat-generating source 21 thereon. The heat-generating source 21 is installed with a cooling fan 22 thereon. The cooling fan 22 in operation moves an air stream to cool down the heat-generating source 21 and dissipate heat therefrom. After having been moved by the cooling fan 22 to cool down the heat-generating source 21, the air stream lingers in the vicinity of the heat-generating source 21 and stays so far from the venting hole 11 that it is necessary to additionally install a ventilation fan 13 at the venting hole 11 so as to vent heat out of the computer casing 1.

According to the prior art, not only is heat generated by peripherals and electronic components installed in a host computer confined to the casing of the host computer, but a plurality of heat sources present inside the casing of the host computer generate heat concurrently, and thus heat is accumulated inside the casing in the same way as the mechanism for greenhouse effect. Hence, it is necessary to additionally install a ventilation fan to facilitate convection between air streams otherwise shut inside the casing and air streams outside the casing. However, the extra ventilation fan always consumes extra power otherwise available to the computer, and thus voltage of the internal power supply system of the computer is rendered unstable. Accordingly, the prior art has the following drawbacks:

1. inefficient heat dissipation,
2. power-consuming, and
3. inefficient convection between air streams inside a casing and air streams outside the casing.

SUMMARY OF THE INVENTION

It is a primary objective of the present invention to provide on a casing at least a heat-dissipating device capable of self-contained operation and capable of removing heat from the casing so as to be power-saving and heat-dissipating.

The present invention provides a heat dissipating structure. The heat dissipating structure includes a casing and at least a power-free heat-dissipating device disposed on the casing. An air stream outside the casing drives the power-free heat-dissipating device to rotate. The rotating power-free heat-dissipating device introduces the air stream into the casing so as to facilitate circulation favorable for heat dissipation, thereby enhancing heat dissipation, enabling power-free operation, and serving a power-saving purpose. Hence, the present invention has the following advantages:

1. power-saving,
2. efficient heat dissipation, and
3. efficient convection between air streams inside a casing and air streams outside the casing.

DETAILED DESCRIPTION OF THE EMBODIMENTS

The present invention is herein illustrated with preferred embodiments and drawings, so that one skilled in the pertinent art can easily understand the technical means and structures employed to achieve the aforesaid objective, other advantages and effects of the present invention from the disclosure of the invention.

Figure 1:
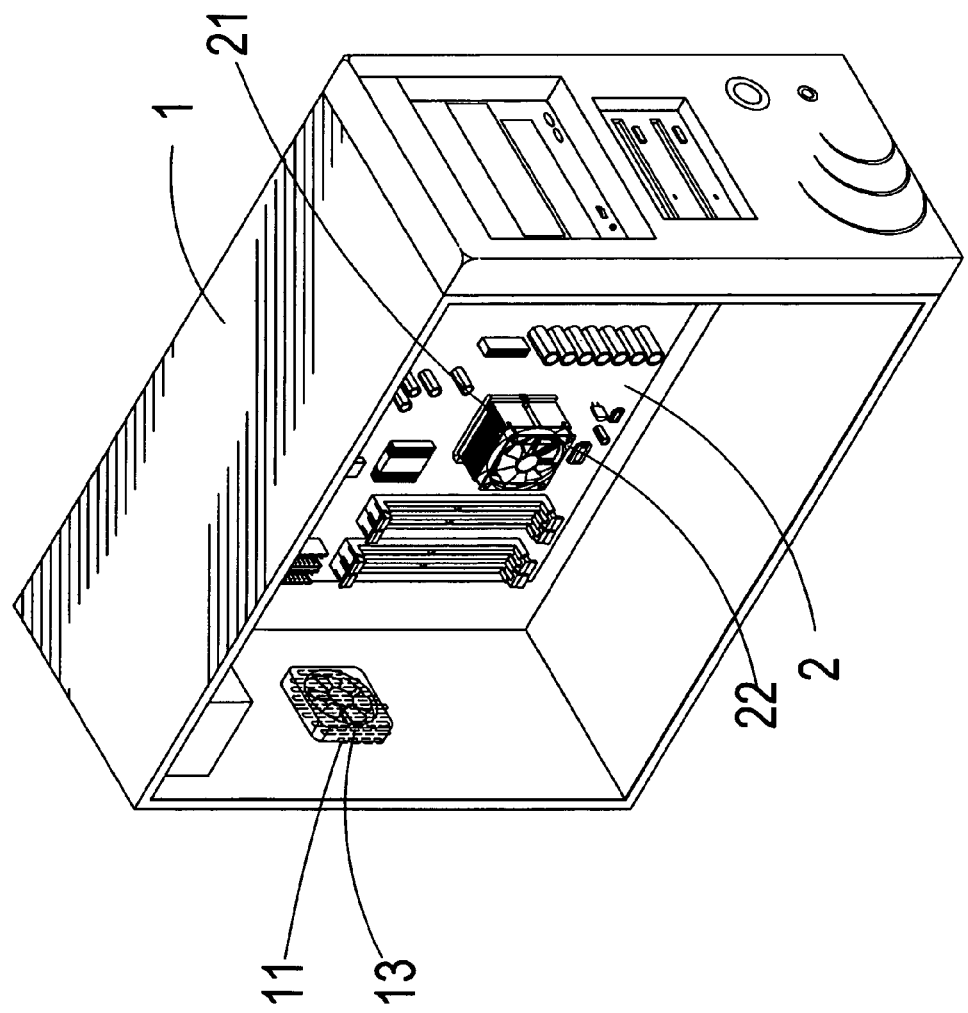
FIG. 1 (PRIOR ART) is a perspective view of the prior art.
Figure 2:
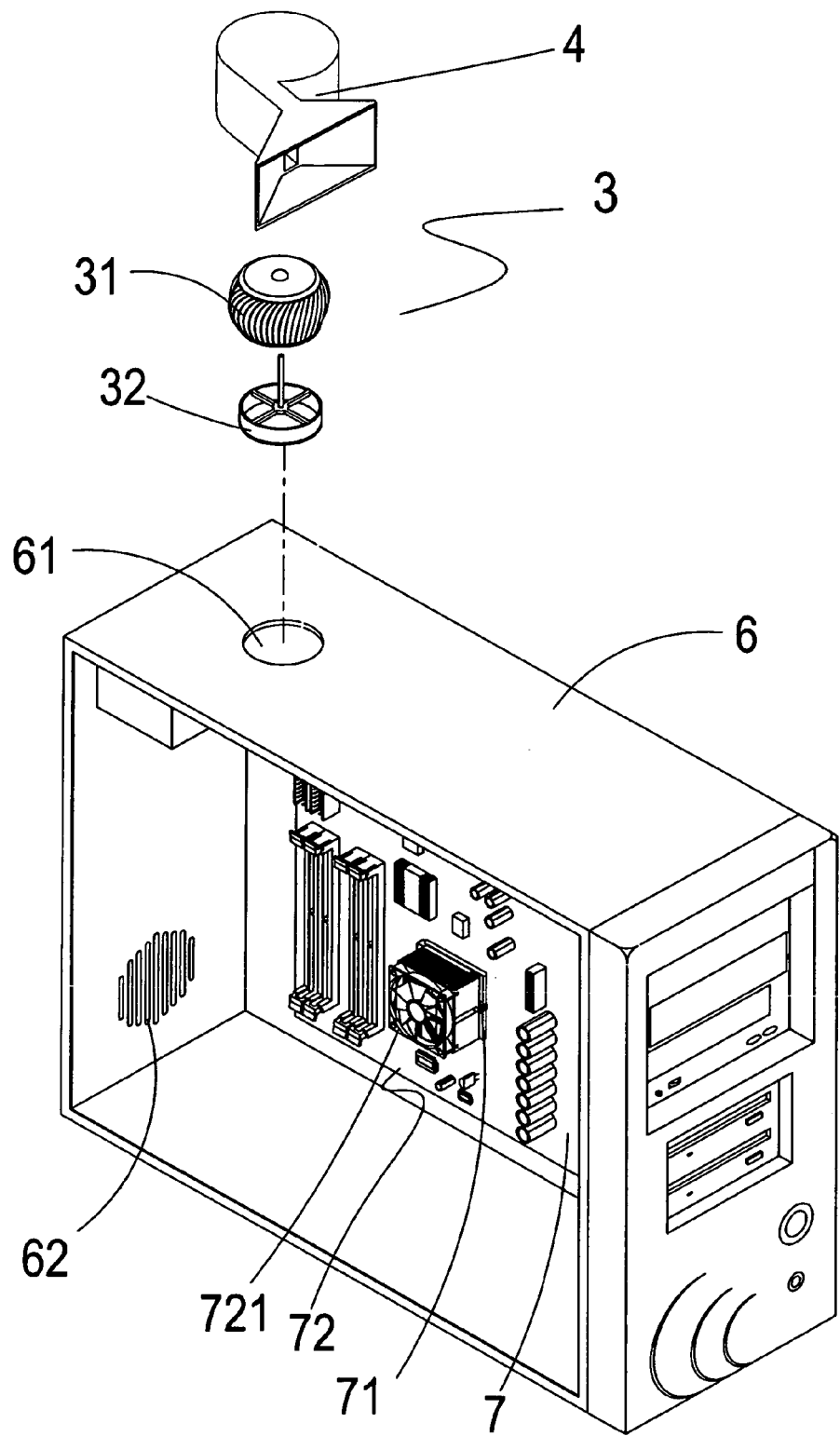
FIG. 2 is an exploded view of a preferred embodiment of the present invention.
Figure 3:
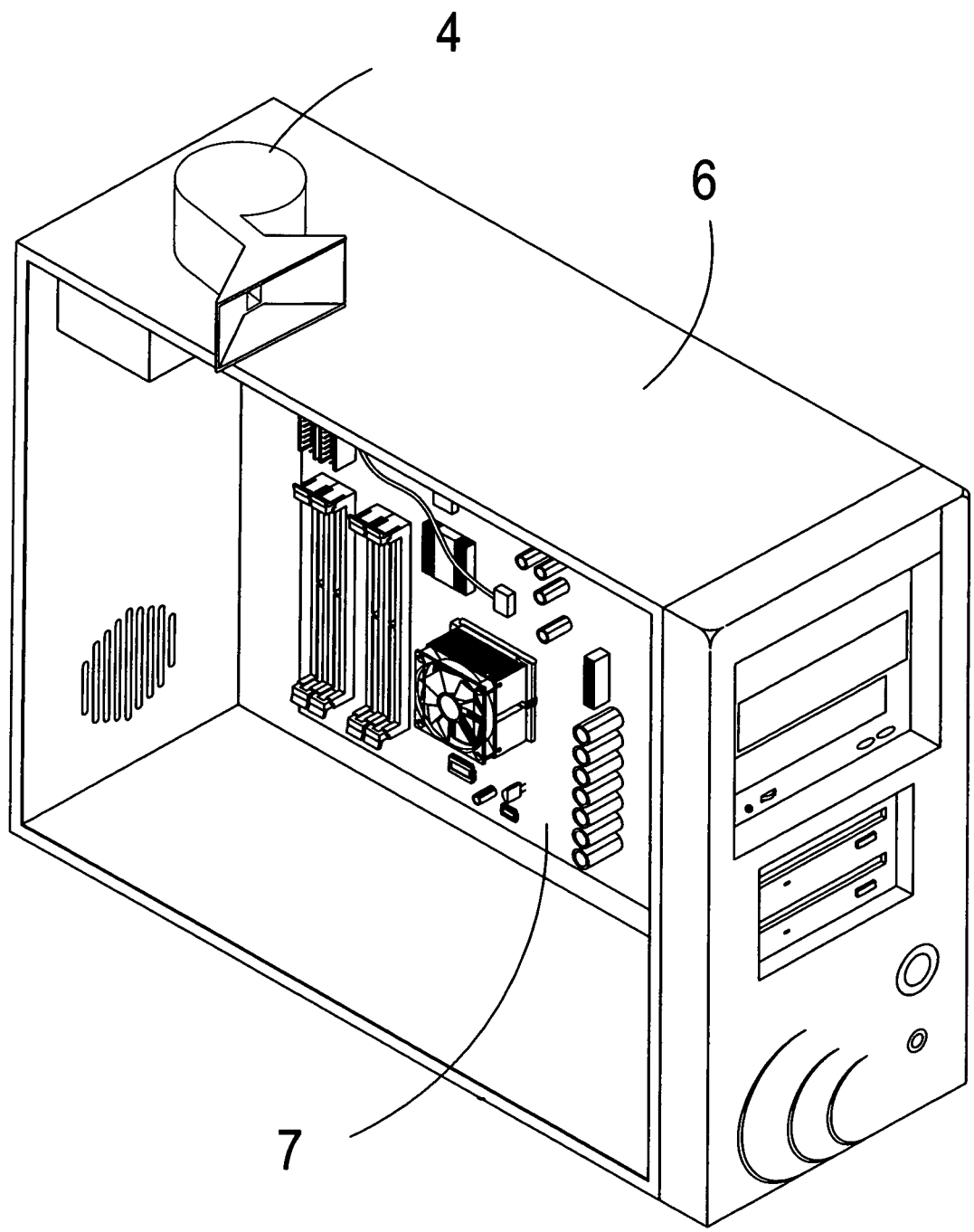
FIG. 3 is a perspective view of the preferred embodiment of the present invention.
Figure 4:
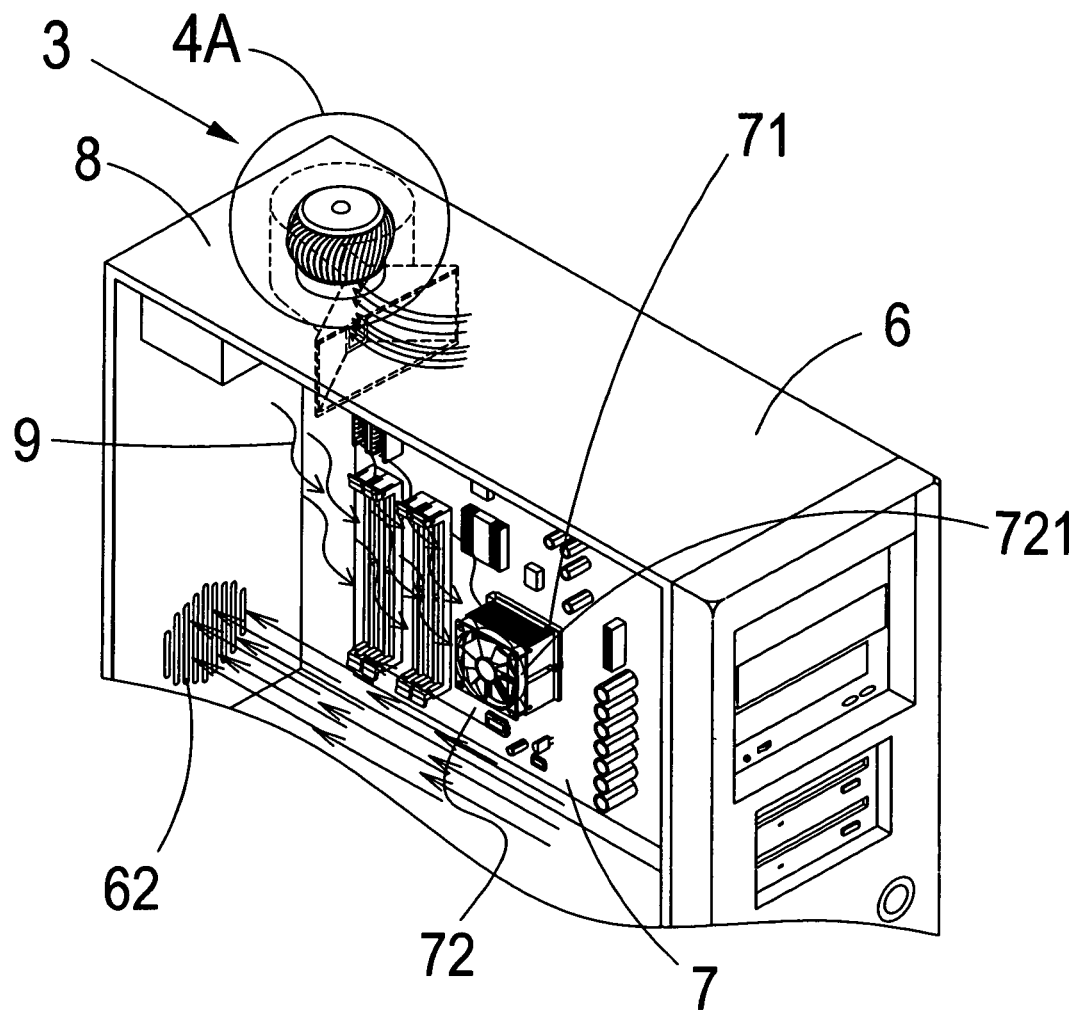
FIG. 4 is a schematic view of the preferred embodiment of the present invention.
Figure 4A:
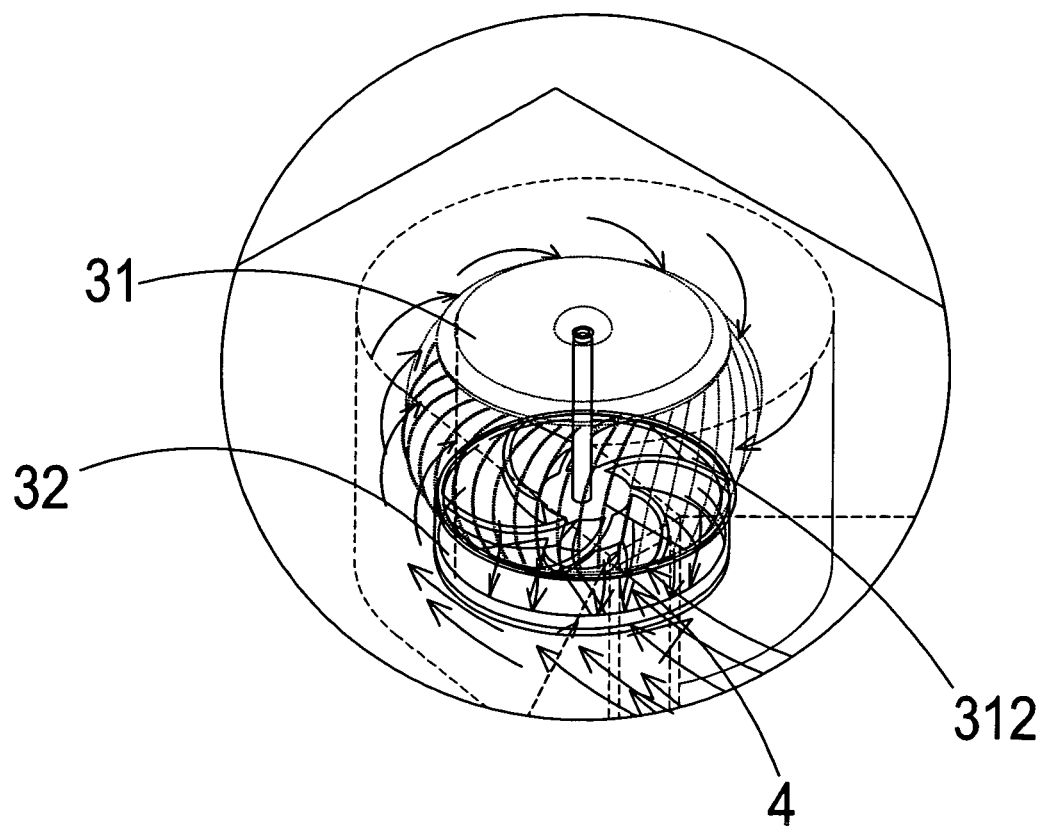
FIG. 4A is an enlarged view showing a power-free heat-dissipating device of the preferred embodiment of the present invention.
Figure 5:
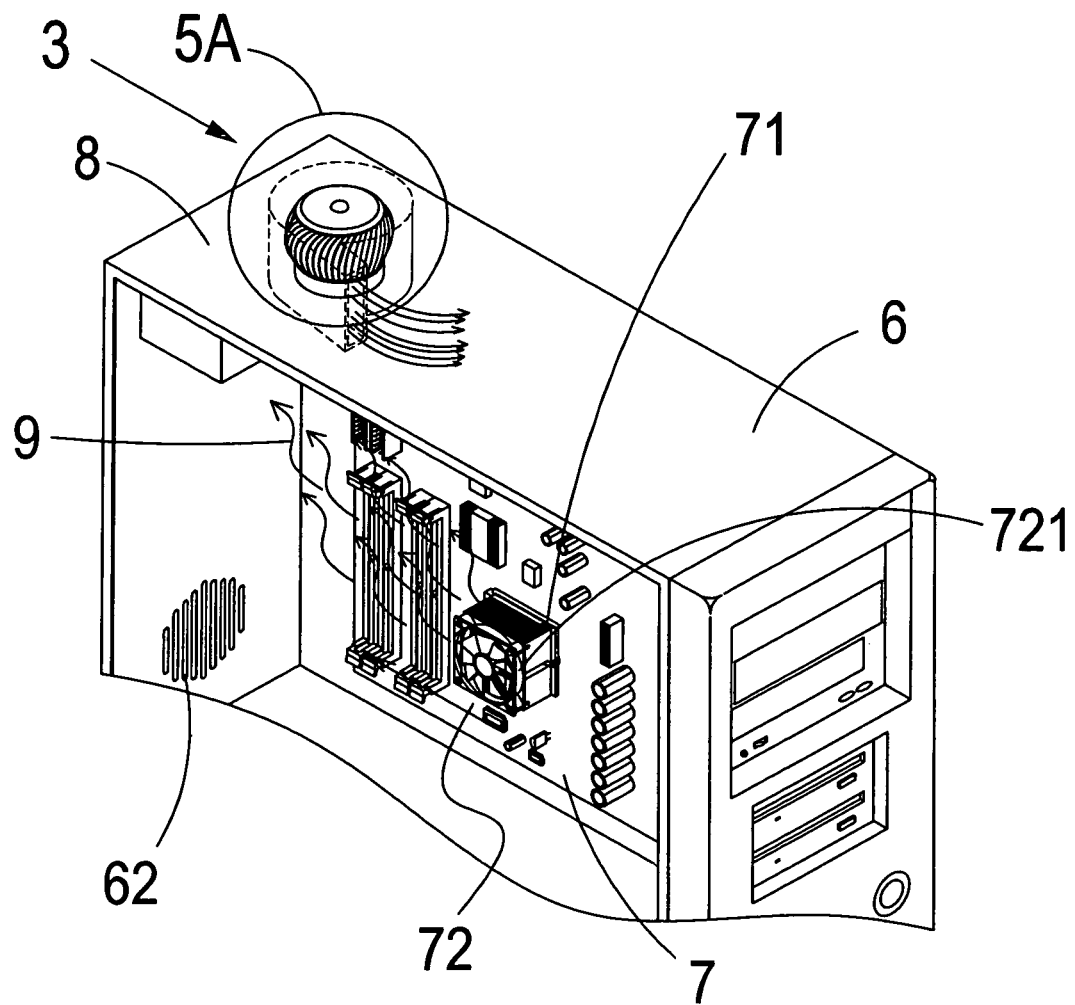
FIG. 5 is a schematic view of another preferred embodiment of the present invention.
Figure 5A:
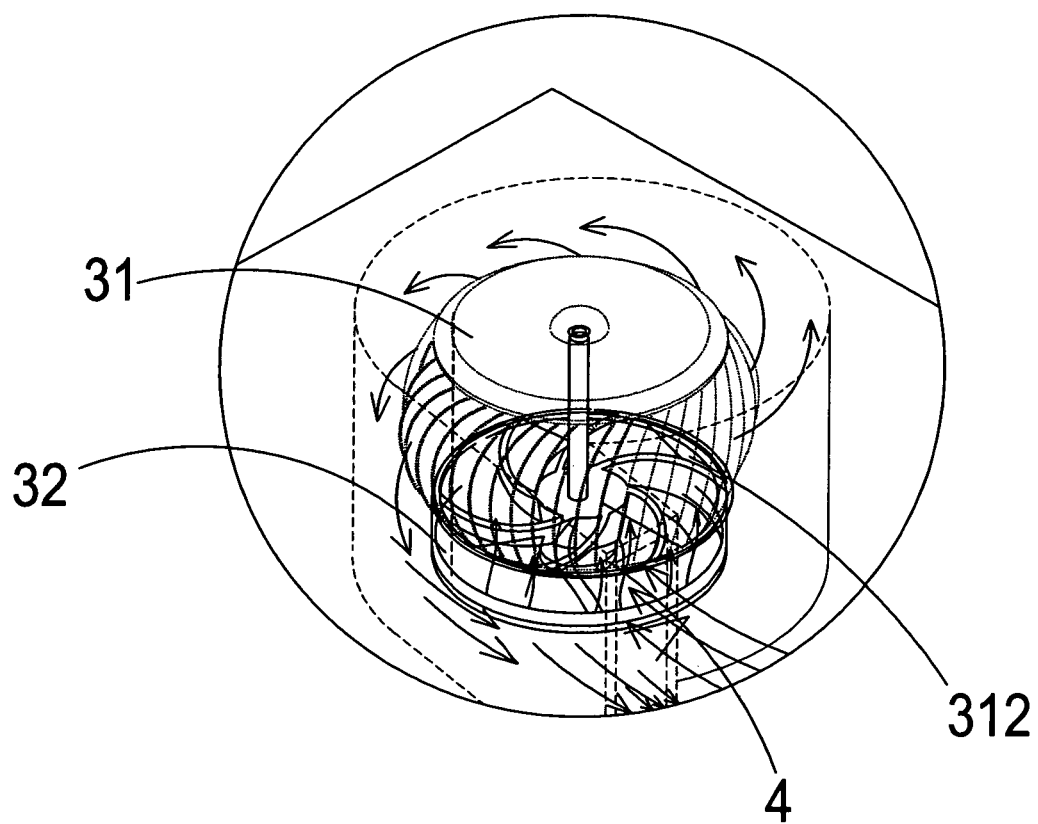
FIG. 5A is an enlarged view showing a power-free heat-dissipating device of the other preferred embodiment of the present invention.
Figure 6:
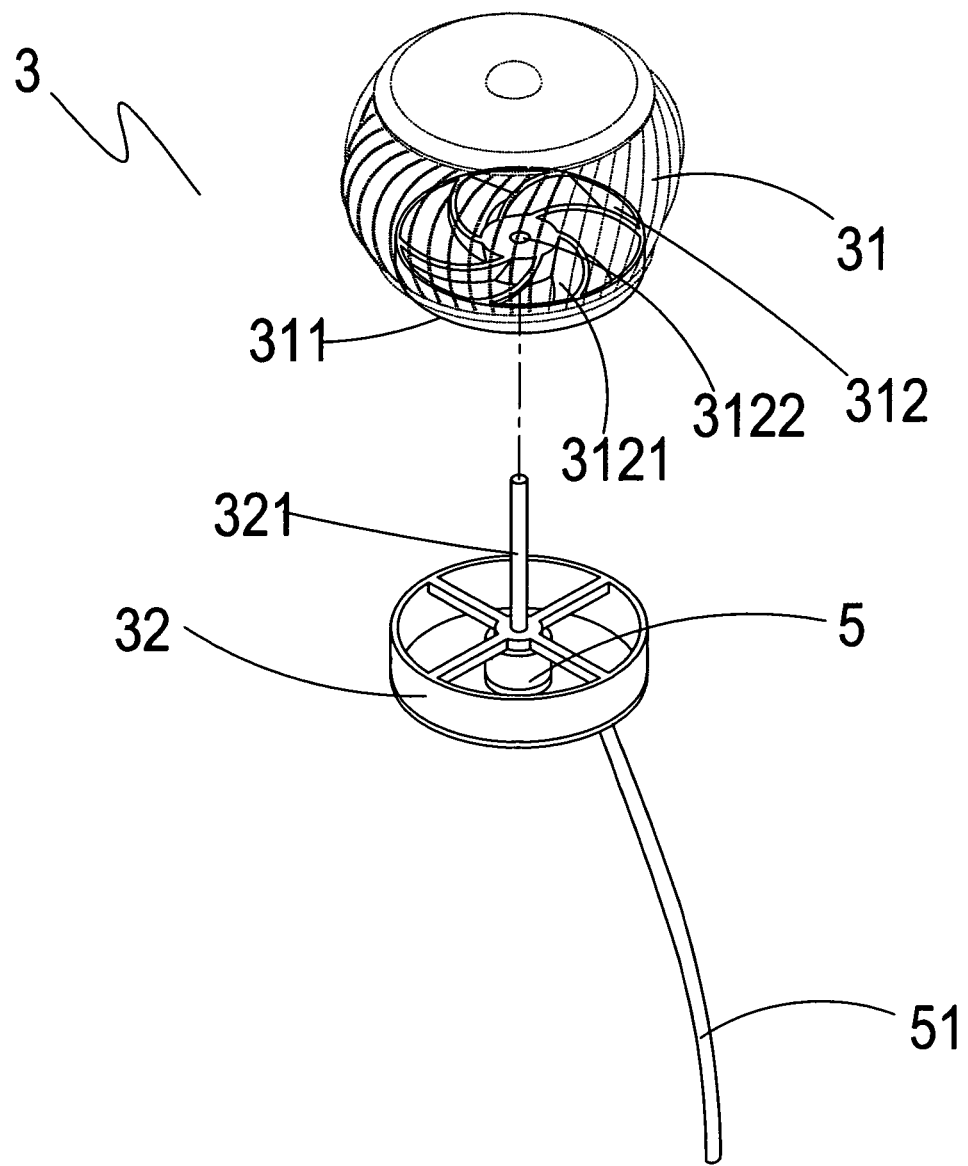
FIG. 6 is an exploded view showing the power-free heat-dissipating device of the other preferred embodiment of the present invention.

Referring to FIGS. 2, 3, 4, 4A, 5, 5A and 6, an electronic equipment casing 6 is provided with at least a power-free heat-dissipating device 3 thereon and a hood 4 for protecting the power-free heat-dissipating device 3. An air stream 8 outside the electronic equipment casing 6 drives the power-free heat-dissipating device 3 to rotate. Owing to the rotation of the power-free heat-dissipating device 3, the cool air stream 8 outside the electronic equipment casing 6 is introduced into the electronic equipment casing 6 to circulate therein, so as to effectuate heat dissipation and save power. With the power-free heat-dissipating device of the present invention, drawbacks of the prior art, namely excessive power consumption and inefficient removal of heat from the casing, are resolved.

The power-free heat-dissipating device 3 comprises a rotating portion 31 and a fixing portion 32. The rotating portion 31 is shaped like a hollow drum and comprises a plurality of strips circumferentially disposed, equidistantly spaced, and partially open. The rotating portion 31 is formed with a receptive opening 311 below. A bladed fan 312 is disposed in the rotating portion 31 and near the opening 311 of the rotating portion 31. The bladed fan 312 comprises a plurality of blades 3121 and is centrally formed with an aperture 3122. The fixing portion 32 has an end extendingly formed with an axle 321 penetratably disposed in the aperture 3122 of the bladed fan 312 so as to be pivotally coupled to the rotating portion 31.

The electronic equipment casing 6 has an upper side and a rear side. The upper side of the electronic equipment casing 6 is formed with a first vent 61 corresponding in position to the power-free heat-dissipating device 3. The rear side of the electronic equipment casing 6 is formed with at least a second vent 62. The second vent 62 exhausts air streams otherwise held inside the electronic equipment casing 6. A motherboard 7 is received inside the electronic equipment casing 6. The motherboard 7 is disposed with a heat-generating source 71 thereon. A heat-dissipating module 72 with a fan 721 is disposed on the heat-generating source 71.

Heat generated by the heat-generating source 71 is dissipated by means of air streams produced as a result of rotation of the fan 721 of the heat-dissipating module 72 disposed over the heat-generating source 71; meanwhile, two routes of circulation favorable for heat dissipation are available. The first route involves collecting the cool air stream 8 outside the hood 4 by means of the hood 4, driving the rotating portion 31 of the power-free heat-dissipating device 3 to rotate by means of the air stream 8, and introducing the air stream 8 into the electronic equipment casing 6 by means of the rotation of the bladed fan 312 in the rotating portion 31. In so doing, the power-free heat-dissipating device 3 speeds up the flow of a hot air stream 9 inside the electronic equipment casing 6 and the expulsion of the hot air stream 9 from the electronic equipment casing 6 via the second vent 62, so as to engender circulation-based heat dissipation and thereby lower the temperature inside the electronic equipment casing 6. The second route involves driving the rotating portion 31 of the power-free heat-dissipating device 3 to rotate by means of the ascent of the hot air stream 9 generated by the heat-generating source 71 and other electronic components inside the electronic equipment casing 6, and driving the hot air stream 9 out of the electronic equipment casing 6 by means of the rotation of the bladed fan 312 in the rotating portion 31. In so doing, the power-free heat-dissipating device 3 speeds up the flow of the hot air stream 9 inside the electronic equipment casing 6 and the expulsion of the hot air stream 9 from the electronic equipment casing 6 via the second vent 62, so as to engender circulation-based heat dissipation and thereby lower the temperature inside the electronic equipment casing 6.

A conversion unit 5 is optionally disposed on the power-free heat-dissipating device 3, or is disposed on the electronic equipment casing 6 (not shown) in a standalone manner. The power-free heat-dissipating device 3 in operation drives the conversion unit 5 to rotate. Kinetic energy generated by the rotation of the power-free heat-dissipating device 3 is converted into electrical energy by the conversion unit 5. The resultant electrical power is transferred, by a wire 51 connected to the conversion unit 5, to other components for usage or storage. Accordingly, a heat dissipating structure of the present invention generates extra power and supplies the extra power to other components for usage or storage with a view to serving a power-saving purpose, thereby solving a drawback of the prior art, namely excessive power consumption.

The above-described descriptions of the embodiments are only to illustrate the preferred implementation according to the present invention, and it is not to limit the scope of the present invention. It is apparent to those skilled in the art that all equivalent modifications and variations made in the foregoing embodiments according to the spirit and principle in the disclosure of the present invention should fall within the scope of the appended claims In conclusion, the heat dissipating structure of the present invention is capable of accomplishing the effect thereof and achieving the objective thereof, and thus the present invention is novel, non-obvious, and useful, and meets all the conditions for filing an invention patent application. The applicant hereby files the invention patent application in hopes of receiving allowance of the invention patent application and securing patent protection.

What is claimed is:

1. A heat dissipating structure, for use in cooling a casing containing electronics comprising:
    an electronic equipment casing having a first opening and a second opening; and
    an electrical power-free heat-dissipating device being a self-rotating portion heat-dissipating fan and located exteriorly at the first opening of the electronic equipment casing, said electrical power-free heat-dissipating device enabling an air stream to be one of expelled from and introduced into the electronic equipment casing, so as to cause the electrical power-free heat-dissipating device to rotate, and cause the air stream one of inside and outside the electronic equipment casing to be one of expelled from and introduced into the electronic equipment casing via one of the first opening and the second opening;
    wherein the first opening is formed on an upper side of the electronic equipment casing, and the second opening is formed on a rear side of the electronic equipment casing wherein the electrical power-free heat-dissipating device further comprises:
    a rotating portion shaped like a hollow drum, comprising a plurality of strips, and formed with a receptive opening below, the strips being circumferentially disposed, equidistantly spaced, and partially open; a bladed fan disposed in the rotating portion and near the opening of the rotating portion, comprising a plurality of blades, and centrally formed with an aperture; and a fixed portion with an end extendingly formed with an axle penetratably disposed in the aperture of the bladed fan so as to be pivotally coupled to the rotating portion.

2. The heat dissipating structure of claim 1, wherein the heat-dissipating device is optionally provided with a conversion unit driven by the heat-dissipating device to perform energy conversion for self-contained power generation.

3. The heat dissipating structure of claim 1, wherein the heat-dissipating device is provided with a hood thereon.

4. The heat dissipating structure of claim 2, wherein the heat-dissipating device is provided with a hood thereon.

* * * * *